United States Patent [19]

Balyasny et al.

[11] Patent Number: 5,788,524

[45] Date of Patent: Aug. 4, 1998

[54] TEST CLIP WITH STANDARD INTERFACE

[75] Inventors: Marik Balyasny, Burbank; Rondal Keith Harmon, Jr., Chino Hills, both of Calif.

[73] Assignee: ITT Manufacturing Enterprises Inc., Wilmington, Del.

[21] Appl. No.: 681,143

[22] Filed: Jul. 22, 1996

[51] Int. Cl.[6] .................................................. H01R 13/629
[52] U.S. Cl. .................................... 439/269.1; 439/70
[58] Field of Search ................................ 439/70, 68, 69, 439/71–73, 269.1, 912; 324/158 P, 158 F

[56] References Cited

U.S. PATENT DOCUMENTS

| | | | |
|---|---|---|---|
| 4,125,313 | 11/1978 | Sipp et al. | 339/176 |
| 4,533,192 | 8/1985 | Kelley | 339/45 |
| 4,547,028 | 10/1985 | Morgan et al. | 339/14 |
| 4,639,058 | 1/1987 | Morgan | 339/17 |
| 4,671,590 | 6/1987 | Ignasiak | 439/266 |
| 4,671,592 | 6/1987 | Ignasiak et al. | 439/331 |
| 4,679,870 | 7/1987 | Pretchel | 439/493 |
| 4,726,115 | 2/1988 | Hartman | 29/858 |
| 4,768,972 | 9/1988 | Ignasiak et al. | 439/330 |
| 4,793,060 | 12/1988 | Pretchel | 29/858 |
| 4,798,544 | 1/1989 | Hartman | 439/404 |
| 4,981,441 | 1/1991 | Ignasiak | 439/269 |
| 4,986,760 | 1/1991 | Petersen et al. | 439/71 |
| 5,055,777 | 10/1991 | Bonelli et al. | 324/158 |
| 5,147,213 | 9/1992 | Funk et al. | 439/266 |
| 5,247,250 | 9/1993 | Rios | 324/158 |
| 5,373,230 | 12/1994 | Balyasny et al. | 439/70 |
| 5,378,164 | 1/1995 | Vidacovich et al. | 439/188 |
| 5,423,688 | 6/1995 | Balyasny | 439/70 |

*Primary Examiner*—Hien Vu
*Attorney, Agent, or Firm*—Freilich Hornbaker Rosen

[57] ABSTRACT

A test clip is described with contacts (50) for engaging leads (26) of an IC (integrated circuit) device, wherein the contacts have lower lead-contacting parts (56) arranged in a single row (62) at a predetermined lead spacing S, and have header pins (60) lying in a header arrangement that allows connection to a standard instrument connector (40). Each contact has an intermediate portion (70) where the contact has a first offset part (72) extending in a longitudinal direction (L) by a distance S/2, and has a second lower offset part that extends partially in a lateral direction (M) by a lateral distance S. The upper first offset part extends horizontally, with 90° angles (76, 78) at it opposite ends, so the contact can be installed by pressing on a shoulder (90) of the first offset part. The first offset part with 90° angles is formed by initially stamping the contact from sheet metal to form a stamped part with such angles and such first offset part. The second, lower offset part extends at an angle (B) from the vertical of about 45° so its opposite ends form angles of 45°, with the second offset part resulting from bending of the stamped contact. The contact intermediate portions (which contains the two offset parts) lie in a recess (104) at the top of the connector housing and are held in place by a header insert (106).

12 Claims, 5 Drawing Sheets

TEST CLIP WITH STANDARD INTERFACE

BACKGROUND OF THE INVENTION

IC (integrated circuit) devices commonly have a body with laterally-spaced opposite sides, and with a longitudinally-extending row of leads at each side that connect to traces on the circuit board. Clips such as test clips are used to temporarily or indefinitely connect to the leads. One type of test clip, described in U.S. Pat. Nos. 5,423,688 and 4,981,441, includes a pair of pivotally connected housings that each carries a longitudinally-extending row of contacts with lower ends that can engage the leads of an IC device.

U.S. Pat. No. 5,423,688 provides a standard header with header pins arranged for connection to a standard header connector. Such standard header connector includes two laterally-spaced rows of header contacts, with the header contacts in each row spaced by 100 mils (one mil equals one-thousandth inch), and with the contacts in the two rows being non-staggered so they lie directly opposite one another and are directly laterally spaced by 100 mils. However, to achieve this, this patent provides separate header pins that each engages a contact at a solder joint. The provision of separate contacts and header pins with solder or other joints between them, adds complication, expense, and electrical resistance.

U.S. Pat. No. 4,981,441 uses wire contacts that each have lower ends positioned for engaging the leads of an IC device, and have upper pin ends forming header pins that can be connected to a connector extending to test instrumentation. However, the upper ends of the contacts for each housing are not in a standard header arrangement, but instead are arranged in two separate rows, with one row lying much higher than the other so a separate connector is required for each row. It would be desirable if a test clip had contacts with lower ends forming lead-engaging parts for directly engaging leads of an IC device, and that had integral upper ends forming header pins arranged in a standard header pattern.

SUMMARY OF THE INVENTION

In accordance with one embodiment of the present invention, a test clip is provided with a row of contacts having lower lead-engaging ends arranged in a single row and having integral upper ends forming header pins, where the header pins lie in a standard header arrangement for connection to a standard header connector. Each of the contacts has an intermediate portion with a first offset part that provides a longitudinal offset, and has a second offset part providing a lateral offset. The header pins are arranged in two sets, each set extending along one row of header pins, and with the contacts of each set preferably being identical to the other set but turned 180° about a vertical axis therefrom.

The first offset part can be formed with substantially 90° angles at its opposite ends. This provides an offset part with a substantially horizontal upper surface which can be pushed down during contact insertion into the connector housing. Such 90° angles are readily provided by stamping the contact from a sheet of metal, with the stamping die formed so the initially stamped contact has the 90° angles. Thereafter, the second offset part is formed by bending the contact at two locations, with bends of much less than 90°, such as 45°, which is readily accomplished by bending.

Upper portions of the contact and the intermediate portion with the two offset parts, can lie in a recess in the housing, and be held in place by a header insert that is press-fit into the recess.

2

The novel features of the invention are set forth with particularity in the appended claims. The invention will be best understood from the following description when read in conjunction with the accompanying drawings.

DESCRIPTION OF THE PREFERRED EMBODIMENTS

Figure 1:
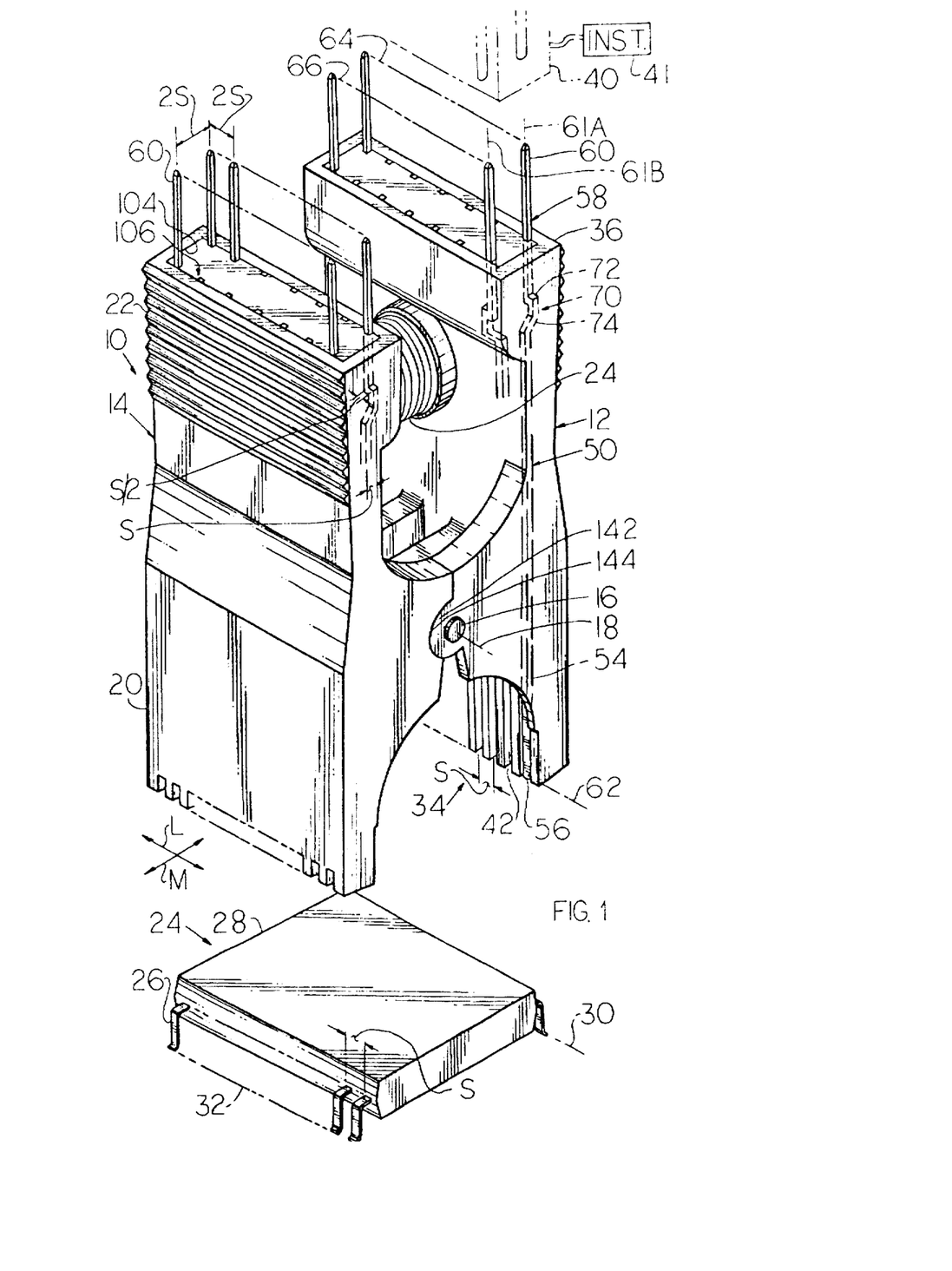
FIG. 1 is an isometric view of a test clip constructed in accordance with the present invention in an open position, shown with the two housings extending vertically and lying over an IC device to which the test clip is to be connected, and also indicating, in phantom lines, a standard instrument cable connector.
Figure 2:
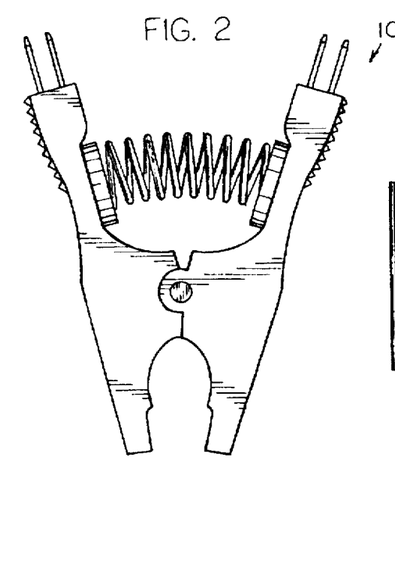
FIG. 2 is a front elevation view of the test clip of FIG. 1, shown in a closed position.
Figures 3, 4:
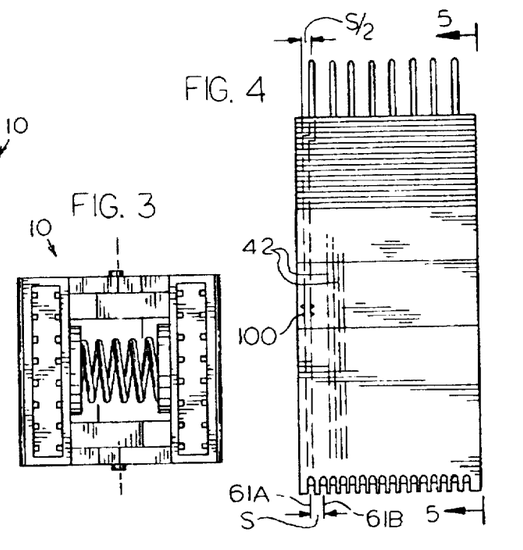
FIG. 3 is a plan view of the test clip of FIG. 1.
FIG. 4 is a side elevation view of the test clip of FIG. 1.

FIG. 1 illustrates a test clip 10 which includes first and second identical housings 12, 14 pivotally connected by a hinge pin 16 at a pivot axis 18. The housings have lower ends 20 which can be spread apart by a person pressing his fingers against upper ends 22 of the housings to press the upper ends together while compressing a coil spring 24. With the upper ends of the housings pressed together, the housing is lowered around an IC (integrated circuit) device 24, so that contacts of the test clip engage leads 26 of the IC device and the housing lower end engages the device body 28. The leads 26 are arranged in two rows 30, 32, with each row extending in a longitudinal direction L, and with the two rows of leads spaced apart in a lateral direction M.

Each test clip housing such as the first one 12 has a lower lead-contacting region 34 where contacts of the test clip can engage to the IC device leads, and has an upper connection region 36 where connections can be made to a cable connector 40 that extends to an instrument 41. The housing has a longitudinally-extending row of contact holding passages 42 extending between the regions, with each passage holding a separate elongated contact 50. The passages are straight and extend substantially parallel to each other, which facilitates injection molding of each housing. The laterally inner ends of the passages are open at the lead-contacting region and the passages of the two housings largely face each other at their laterally inner ends.

Each contact 50 has a lower portion 54 with a lead-contacting part 56, and has an upper portion 58 with an upper mating part in the form of a header pin 60. While the lead-contacting lower parts 56 of the contacts extend in a single longitudinally-extending row 62, the header pins 60 extend in two header pin rows 64, 66. The two rows 64, 66 of header pins are laterally spaced in the lateral direction M, and are non-staggered so one pin in each row lies directly laterally across from a pin in the other row. This arrangement of the header pins 60 is a "standard" arrangement that enables a standard cable connector 40 to be mated to the header pins.

In one test clip, the contact-holding passages 42 are longitudinally spaced apart by a lead-spacing distance S such as 50 mils (one mil equals one-thousandth inch) equal to the spacing of the leads 26 along each lead row. The header pins 60 are longitudinally spaced along each header pin row 64, 66 by a distance 2S, which is 100 mils. The two rows 64, 66 are laterally spaced by a distance 2S. This arrangement has become popular, in part, because it provides a space around each header pin 60 where, if necessary, a discrete clip can be connected.

In accordance with the present invention, applicant provides contacts 50 of a construction and mounting arrangement, that enables the lower ends of the contacts to be spaced apart along the single row 62, while allowing the header pins 60 formed by the upper ends of the one-piece contacts, to be arranged in the standard connection arrangement described above. To accomplish this, applicant forms each contact with an intermediate portion 70 that contains first and second offset parts 72, 74. The first offset part 72 extends in a longitudinal direction by a distance S/2 (FIG. 9) so the opposite ends 76, 78 of the first offset part are spaced apart by the distance S/2. The second offset part 74 is constructed so its opposite ends 92/94 (FIG. 11) are laterally offset by a distance S. As will be discussed below, this double offset in two perpendicular directions, enables the lead-contacting lower ends of the contacts to be spaced along a single row while the upper or header pin ends of the contacts are arranged in a standard header arrangement.

Figures 7, 8, 9:
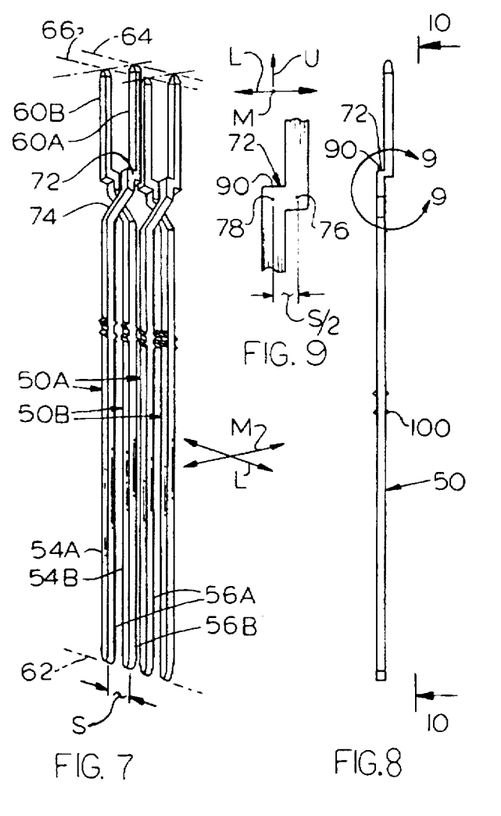
FIG. 7 is an isometric view of a group of contacts of the connector of FIG. 1, without the housing.
FIG. 8 is a side elevation view of one of the contacts of FIG. 7.
FIG. 9 is an enlarged view of the area 9—9 of the contact of FIG. 8.

FIG. 7 shows two sets of contacts, including contacts 50A of the first set (whose header pins 60A extend along the first row 64) and contacts 50B of the second set (whose header pins 60B extend along the second row 66). This figure shows that the first longitudinal offset part 72 extends in the longitudinal direction L, while the second offset part 74 extends in the lateral direction M. Even though the header pins 60A, 60B are directly laterally spaced, the second offset parts 74 results in their lower portions 54A, 54B extending along the same single row 62 of lead-contacting lower parts. The lead-engaging lower parts 56A, 56B of the two contacts are longitudinally spaced by the distance S. However, the first offset part 72 of each contact results in the header pins 60A, 60B lying directly laterally across from each other. The two groups of contact lower parts 56A and 56B are staggered along the single row 62, so each lower part 56B of a contact of a first group of contacts, lies between the lower parts 56A of two contacts of the second group.

Figure 12:
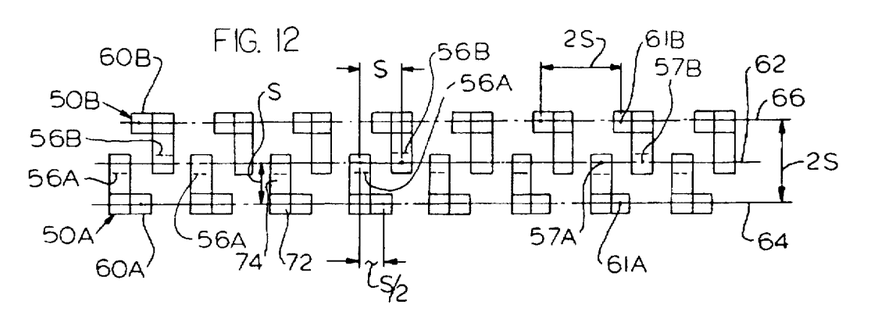
FIG. 12 is a plan view of only the contacts in one of the housings of the connector of FIG. 1.

FIG. 12 shows the arrangements of the contacts 50A and 50B whose header pins 60A, 60B lie in the two rows 64, 66, but whose lower ends, or lead-contacting lower parts 56A, 56B lie in a single longitudinally-extending row 62. The header pins have primarily vertical header pin axes 61A, 61B, while the lead-contacting lower parts have parallel lower part axes 57A, 57B that are offset from the header pin axes. It can be seen that where the lead-contacting parts 56A, 56B are each spaced by the distance S, that the two header pins 60A, 60B can be aligned laterally by each first offset part 72 providing an offset of S/2. It also can be seen that where the two header pin rows 64, 66 are to be spaced by the distance 2S (100 mils) that each second offset part 74 provides an offset S. The arrangement of FIG. 12 allows the two sets of contacts 50A, 50B to be identical, but with the second contacts 50B turned 180° about a vertical axis from the first contacts 50A.

Figures 10, 11:
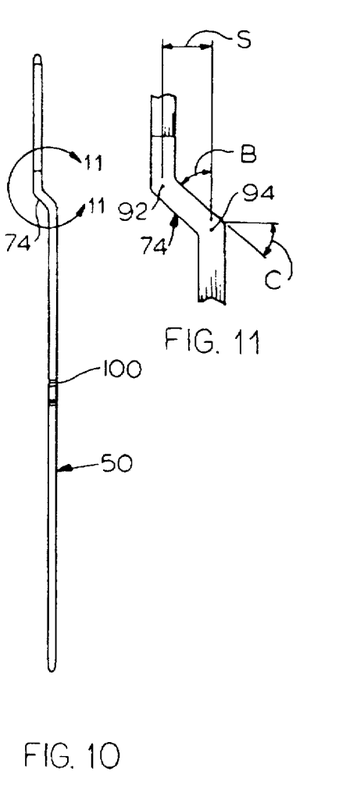
FIG. 10 is an end elevation view of the contact of FIG. 8, taken on line 10—10 of FIG. 8.
FIG. 11 is an enlarged view of the area 11–11 of the contact of FIG. 10.

FIGS. 8 and 10 indicate the manner in which each contact 50 is constructed. Applicant prefers to form the contacts from sheet metal, by first stamping each contact so it has the initial stamped shape shown in FIG. 8. This avoids the need to bend the contact at two very closely spaced locations that are spaced by the distance S/2 (which is 25 mils in the above example). Also, this allows the first offset part 72 to extend substantially horizontally (less than 20° and preferably less than 10° from the horizontal) in the longitudinal direction L, so its upper surface 90 faces upwardly in direction U. Such upwardly facing surface 90 makes the contact easier to install in the connector housing. It is noted that the connector has a rectangular (preferably square) cross-section, with each side having a width of S/2. It would be difficult to form 90° bends in the contact at such closely spaced angled locations 76, 78. By applicant stamping the contact, the contact can be readily formed with the closely spaced 90° angles at opposite ends of the first offset part 72.

After the contact has been stamped from sheet metal, it is bent to form the second offset part 74 shown in FIG. 11. Applicant does not need a horizontal shoulder for the second part, and forms the opposite ends 92, 94 of the second part with 45° angles. Bending of the contact to such angles is easily accomplished, especially because the opposite ends at 92, 94 of the second part are spaced by a considerable lateral distance S, and because each bend is much less than 90°. A variety of angles B from the vertical and C from the horizontal can be used, which are preferably between 20° and 70° for ease in bending and to avoid over stressing the material of the contact as the result of such bending. An examination of a finished contact easily reveals that the first offset part 72 is stamp-formed (formed in the process of stamping the contact) and that the second offset part is formed by bending the stamped contact.

Each contact has barbs 10° to hold it in position in one of the passages 42. To install a contact into a passage, considerable downward force has to be applied to the contact. Such downward force is applied to the shoulder 90 by an installing tool. The contact extends vertically below the shoulder 90.

Figures 5, 6:
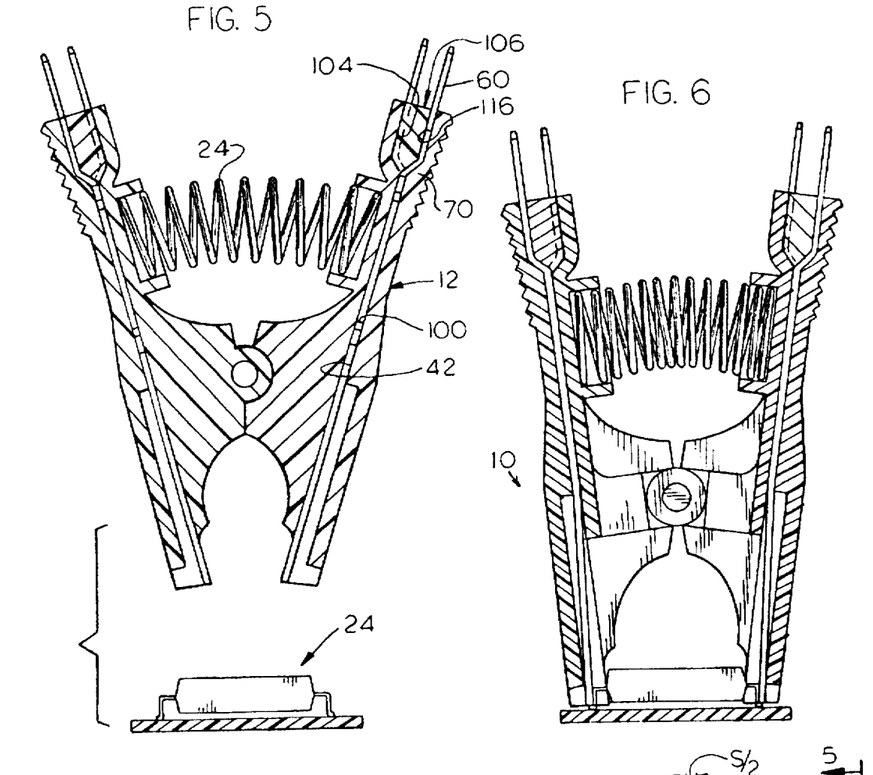
FIG. 5 is a sectional view taken on line 5—5 of FIG. 4, with the test clip in its open position, and also showing the IC device on a circuit board.
FIG. 6 is a view similar to that of FIG. 5, but with the test clip clipped onto the IC device.
Figure 13:
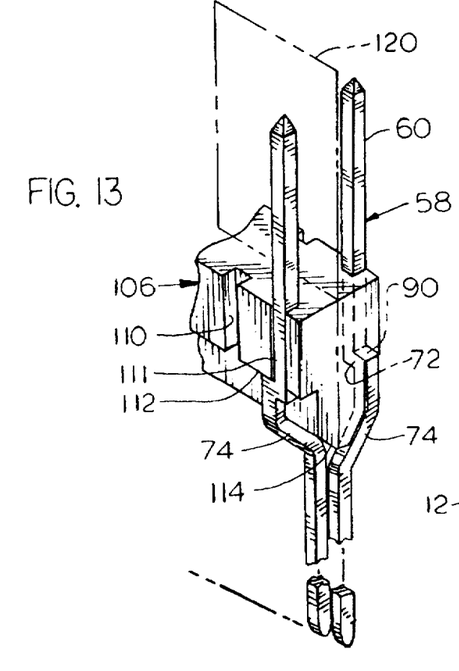
FIG. 13 is a partial isometric view of one of the header inserts of the test clip of FIG. 1, shown with two contacts thereon.
Figure 14:
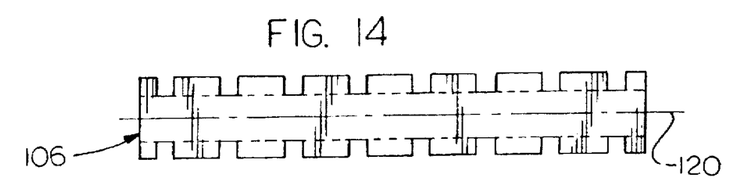
FIG. 14 is a plan view of the insert of FIG. 13.
Figures 15, 16:
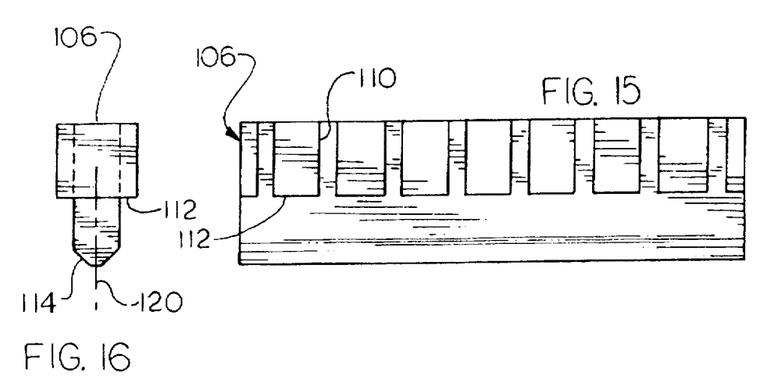
FIG. 15 is a side elevation view of the insert of FIG. 13.
FIG. 16 is an end elevation view of the insert of FIG. 13.
Figure 17:
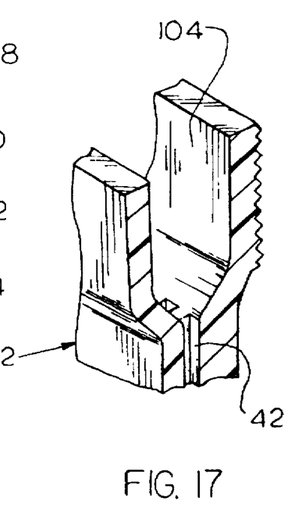
FIG. 17 is a partial isometric view of one of the housings of the test clip, showing a portion that receives the insert of FIG. 13.

As shown in FIG. 5, each housing such as 12 has a recess 104 at its upper end to accommodate the intermediate portions 70 of the contacts installed in that housing, which include the first and second offset parts of the contact. A header insert 106 lies in the recess. The header insert 106 prevents substantial bending of each contact below the upwardly projecting header pin 60, and helps to prevent a contact from being pushed upward or downward during connection or disconnection of an instrument connector. The header insert also provides better contact alignment at the top of the interface. FIG. 13 shows that the header insert 106 has vertical slots 110 that receive parts 111 of the contact upper portions 58 that lie immediately below the projecting header pins 60. The header insert forms downwardly-facing shoulders 112 that substantially abut the upwardly-facing shoulders 90 of the contacts at the first offset parts 72 of the contacts. The header also has an inclined wall 114 on each side, which extends at the same angle (45° from the vertical) as the second offset part 74 of each contact. The inclined walls extend downwardly and toward the centerplane 120 of the header.

FIG. 5 shows the shape of the recess 104 in each housing. The recess 104 is constructed to closely receive each contact between the header insert 106 and the inside walls 116 of the recess 104. The header 106 is preferably press-fit into the recess 104. Although the contacts lie closely against the header and the walls of the recess 104, they are preferably not rigidly trapped in place between them.

Referring again to FIG. 1, it can be seen that the two housings 12, 14 are identical, but are turned 180° from each other. The two housings have pivot portions along the hinge pin 16 where the housings are pivotally connected. Each housing is injection molded. The contacts are stamped and bent as described above, and are installed by pressing them downwardly into place, using a tool that presses against a upwardly-facing shoulder 90 (FIG. 9) of the contacts. For mass assembly, the contacts are provided in two rows, with the contacts of each row being turned 180° from each other, and all contacts can be pressed downwardly into place. The header insert is then pressed down into place.

Figures 18, 19:
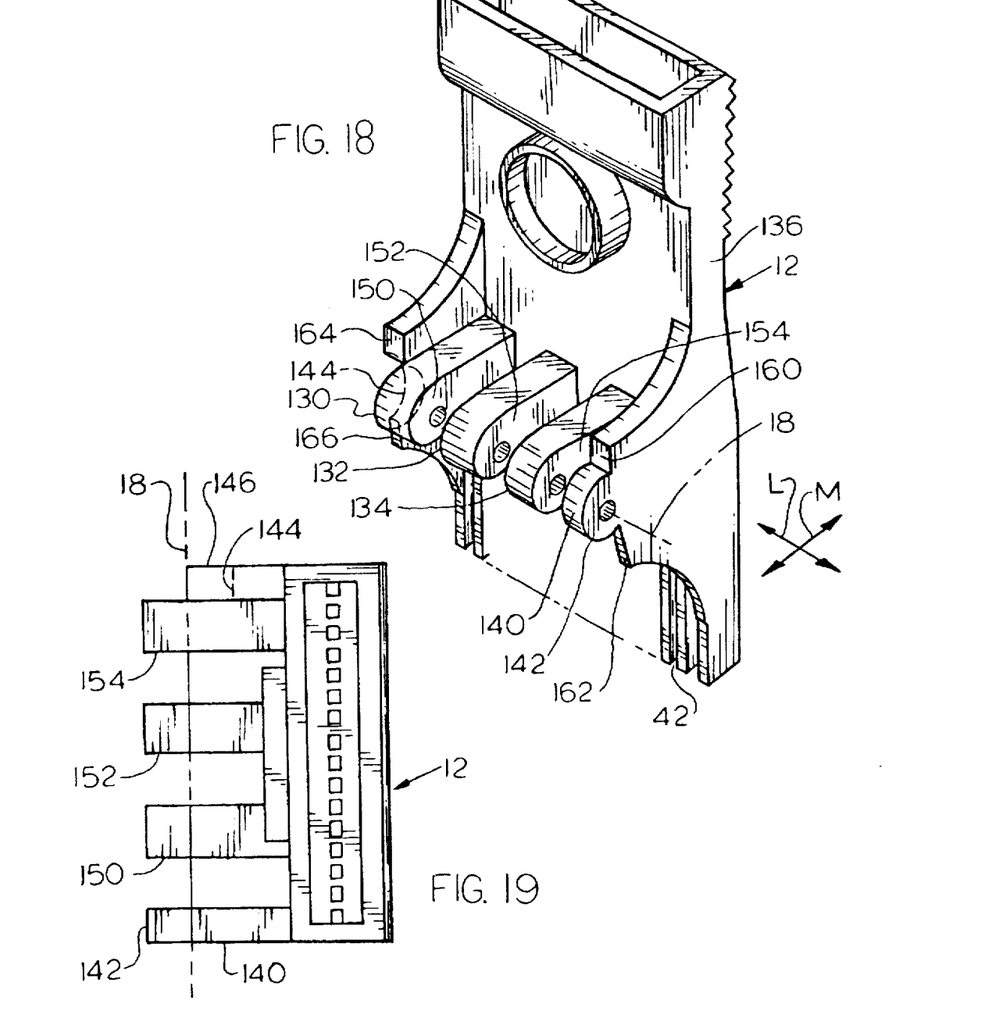
FIG. 18 is an isometric view of one of the housings of the test clip of FIG. 1.
FIG. 19 is a plan view of the housing of FIG. 18.

Each housing has the shape shown in FIGS. 18 and 19 with the housing 12 having a plurality of arms 130, 132, 134 projecting laterally (M) from a main housing portion 136 which forms the contact-holding passages 42. A long end arm 140 at one longitudinal end of the housing has a cylindrically-rounded end 142 which fits into a recess 144 at the end of a short arm 146 located at the opposite end of the other (identical) housing. Gaps 150, 152, 154 receive the ends of the arms of the other housing. The end arms form stop surfaces 160, 162 that are preferably angled about a half circle about the pivot axis 18 and stop surfaces 164, 166 that are also angled about a half circle. The stops permit housing pivoting of only about 30°. The recess 144 is formed to surround the cylindrically rounded end 142 by slightly more than 180° (not over 190°), so the rounded end 142 snaps into the recess when moved laterally therein.

Thus, the invention provides a test clip of relatively simple construction, wherein a group of contacts for engaging one row of leads of an IC device, are arranged with their lower lead-contacting parts extending along a single longitudinally-extending row, but with their upper ends arranged in two rows in a non-staggered arrangement that enables connection to a standard header connector. This can be accomplished by the use of contacts that each have two offsetting parts, one providing slight offset in a longitudinal direction L, and the other providing a larger offset in a lateral direction M. All contacts can be identical, with a second group of contacts turned 180° about a vertical axis with respect to a first group of contacts. Each contact can be formed by stamping from sheet metal to provide a short first offset part with substantially 90° angles at its opposite ends. The stamped contact is then bent to form the second offset portion, with the bends preferably being between 20° and 70° to leave an inclined second offset portion lying below the first one.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A test clip for connecting the leads of an IC device, that has a longitudinally-extending row of leads, through an instrument connector to a test instrument, comprising:

a test clip housing having a lower lead-contacting region (34) and an upper connection region (36), said housing having a row of contact holding passages extending between said regions;

a plurality of elongated contacts each lying in one of said passages, each contact having a lower portion (54) with a lead-contacting lower part (56) lying at said lead-contacting region and an upper portion (58) lying at said connection region, said contacts comprising first and second sets of contacts with lead-contacting lower parts that are staggered along a single row of contact lower portions so the lower part of each of a plurality of second contacts lies between a pair of lower parts of two of said first contacts;

the upper portion of each of said contacts forms a header pin extending along a header pin axis and each contact lead-contacting lower part extends along a lower part axis that is substantially parallel to, but offset from the header pin axis of the same contact;

said contact lead-contacting lower parts (56) lie at a predetermined lead spacing (S) along said single row, and said contact header pins (60) lie in two header pin rows (64,66), with the two header pin rows being non-staggered so each header pin in a first header pin row lies directly across a header pin in the second header pin row, and with the contact header pins in each of said header pin rows spaced apart by twice(2S) said lead spacing;

for each contact whose header pin lies in said first header pin row, the header pin is offset from the lower part of the contact in a longitudinal (L) direction by half (S/2) of said lead spacing and is offset from the contact lead-contacting lower part in a lateral direction (M), which is perpendicular to said longitudinal direction (L), by said lead spacing (S), with said first and second contacts being substantially identical but turned 180 degree from each other about their lower axes whereby to enable the header pins to be connected to a nonstaggered header connector.

2. The test clip described in claim 1 wherein:

each of said contacts has an intermediate portion where contact locations are offset from one another as viewed along the header pin axis of the contact, to produce said offsets of the lead-contacting lower part of each contact and the header pin of the same contact;

the intermediate portion of each contact has a first offset part that extends with a longitudinal direction component, and has a second offset part that extends with a lateral directional component, when said upper contact axis extends vertically;

each of said contacts is stamped from sheet metal to form a stamped part containing one of said parts, and each of said contacts has bends forming the other of said parts.

3. The test clip described in claim 2 wherein:

for each of said contacts said first offset part lies above said second offset part and said first offset part extends substantially horizontally, whereby to provide a surface that can be easily depressed to install the contact;

said first offset part being said one of said parts that is formed as a stamped part prior to bending.

4. The test clip described in claim 3 wherein:

said second part extends at an incline of more than 20° from the horizontal while said first part extends at less than 20° from the horizontal.

5. A test clip for connecting to the leads of an IC device that has a pair of longitudinally-extending rows of leads, comprising:

a pair of housings each having a longitudinally extending row of largely vertically-extending passages, with said housings each having a lower end where said passages have open inner sides largely facing each other, and each of said housings has an upper end with a longitudinally-extending elongated header recess therein that is open to all of the passages of the corresponding housing;

a plurality of elongated contacts each lying in a different one of said passages of one of said housings, with each contact having a contact lower portion lying in one of said housing lower ends, a contact upper portion extending through said recess and extending vertically above the corresponding housing to form a header pin, and a contact intermediate portion;

for each of a plurality of said contacts, said upper portion and said lower portion have substantially parallel axes that are offset from each other, with the intermediate portion of each of said plurality of contacts having offset parts lying in said recess;

a header insert lying closely in said header recess and confining each of at least part of each contact upper portion to control the orientation of each header pin so the header pin extends vertically through an upper part of said header insert and continues vertically above said header insert.

6. The test clip described in claim 5 wherein:

said header insert lies in interference fit with the wall of said recess but not with said upper portions of said contacts.

7. A test clip contact comprising:

a vertically elongated contact of rectangular cross-section that has substantially vertically extending elongated upper and lower contact parts that each extends substantially parallel to a vertical direction, with said upper and lower contact parts being precisely offset in both longitudinal and lateral directions that are perpendicular to each other and to said vertical direction, said contact including a first offset part (72) that has opposite ends and that extends horizontally in a longitudinal direction and which forms right angles at its opposite ends, and a second offset part (74) that is spaced from said first offset part with said second offset part extending at a downward incline from the vertical of between 20 degrees and 70 degrees from the vertical direction and partially in a lateral direction and that has bends of between 20 degrees and 70 degrees at opposite ends of the second offset part;

said contact is stamped in its final shape except for said second offset part, so said rectangular shape and said first offset part with said right angles are stamp-formed;

said bends of between 20 degrees and 70 degrees at the opposite ends of said second part are post-stamped bends in an elongated portion of said contacts of rectangular cross-section, whereby to obtain offsets in two perpendicular directions.

8. The test clip contact described in claim 7, wherein:

said contact is of square cross-section with each side having a length S/2, said first offset part has a length of S/2, and said second offset part has a length in said lateral direction of S.

9. A test clip which includes a pair of housings that are pivotally connected about a longitudinally-extending pivot axis and that each has a plurality of contacts with lead-engaging lower ends extending in a row to engage leads of an IC device, wherein:

said housings of said pair are primarily identical but with one turned 180 degrees about a vertical axis from the other;

each housing has longitudinally opposite first and second ends, a laterally-extending long end arm at said first end and a shorter laterally-extending end arm at said second end, with said shorter end arm having a laterally opening recess and with said long end arm having a rounded end that is substantially cylindrically rounded about said pivot axis, with each rounded end of a long arm of a housing being received in the recess of the other housing, to thereby locate said housings relative to each other in lateral and vertical directions, wherein said long end arm and said short end arm each has a pinhole for receiving a hinge pin to pivotally connect said housings.

10. The test clip described in claim 9 wherein:

said first end arm of each housing has a pair of largely laterally-facing first stop surfaces (160, 162) lying respectively above and below said long arm rounded end and angled by about a half circle from each other around said pivot axis, and said second end arm has upper and lower second stop surfaces (164, 166) lying respectively above and below said recess and angled about a half circle from each other around said pivot axis and positioned to engage said first stop surfaces when said housings pivot, with angles of said angling chosen to permit pivoting of said housings by about 30° about said pivot axes.

11. The test clip described in claim 9 wherein:

said recess has recess walls formed to surround said cylindrically rounded end by slightly more than 180° but less than 190°, to allow said rounded end to snap into said recess.

12. A test clip for connecting to the leads of an IC device that has a pair of longitudinally-extending rows of leads, comprising:

a pair of housings, each having a longitudinally extending row of largely vertically-extending passages, with said housings each having a lower end where said passages have open inner sides largely facing each other, and each of said housings has an upper end with a longitudinally-extending elongated header recess therein that is open to all of the passages of the corresponding housing;

a plurality of elongated contacts each lying in a different one of said passages of one of said housings, with each contact having a contact lower portion lying in one of said housing lower ends, a contact upper portion extending through said recess and above the corresponding housing to form a header pin, and a contact intermediate portion;

for each of a plurality of said contacts, said upper portion and said lower portion have substantially parallel axes that are offset from each other, with the intermediate portion of each of said plurality of contacts having offset parts extending at an incline of a plurality of degrees to said axes and lying in said recess;

a header insert lying closely in said header recess and confining each at least part of each contact upper portion to control the orientation of each header pin;

said header insert has a center plane;

each of said contact upper portions has an axis, each contact intermediate portion has an upper offset part extending substantially longitudinally and perpendicular to the axis of the upper portion, and each contact intermediate portion has a lower offset part extending downwardly and toward said center plane at an angle of between 20° and 70° to the axis of the upper portion;

said header insert has a plurality of largely vertical slots that each receives one of said contact vertical portions, a plurality of downwardly-facing shoulders that each lies substantially against one of said upper offset parts, and an inclined header insert surface extending downwardly and toward said center plane and lying substantially against one of said lower offset parts.

* * * * *